(12) United States Patent
Kurashima et al.

(10) Patent No.: US 7,827,681 B2
(45) Date of Patent: Nov. 9, 2010

(54) METHOD OF MANUFACTURING ELECTRONIC COMPONENT INTEGRATED SUBSTRATE

(75) Inventors: Nobuyuki Kurashima, Nagano (JP); Tadashi Arai, Nagano (JP); Hajime Iizuka, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 164 days.

(21) Appl. No.: 12/137,867

(22) Filed: Jun. 12, 2008

(65) Prior Publication Data

US 2008/0307642 A1  Dec. 18, 2008

(30) Foreign Application Priority Data

Jun. 15, 2007   (JP) .............................. 2007-159223

(51) Int. Cl.
*H05K 3/30* (2006.01)
*H01L 23/04* (2006.01)

(52) U.S. Cl. .............................. 29/832; 29/830; 29/840; 29/852; 257/698; 438/622; 438/623

(58) Field of Classification Search ................... 29/825, 29/830, 832, 840, 852; 257/698; 438/622, 438/623

See application file for complete search history.

(56) References Cited

U.S. PATENT DOCUMENTS

| 7,235,477 | B2 * | 6/2007 | Ogawa | 438/622 |
| 7,473,992 | B2 * | 1/2009 | Ogawa | 257/686 |
| 2006/0087020 | A1 * | 4/2006 | Hirano et al. | 257/686 |
| 2006/0125083 | A1 * | 6/2006 | Ogawa | 257/700 |
| 2007/0145568 | A1 * | 6/2007 | Ogawa | 257/698 |

FOREIGN PATENT DOCUMENTS

JP    2003-347722        12/2003
WO    2004/006331 A1 *    1/2004

* cited by examiner

*Primary Examiner*—C. J Arbes
(74) *Attorney, Agent, or Firm*—Rankin, Hill & Clark LLP

(57) ABSTRACT

There are provided the steps of mounting a semiconductor chip on a first substrate, providing an underfill resin between the semiconductor chip and the first substrate, forming a through hole on a second substrate, providing an electrode on the second substrate, bonding the first and second substrates to include the semiconductor chip through the electrode, and filling a sealing resin between the first and second substrates at a filling pressure capable of correcting a warpage generated on the semiconductor chip and the first substrate while discharging air from the through hole.

7 Claims, 12 Drawing Sheets

METHOD OF MANUFACTURING ELECTRONIC COMPONENT INTEGRATED SUBSTRATE

This application claims priority to Japanese Patent Application No. 2007-159223, filed Jun. 15, 2007, in the Japanese Patent Office. The Japanese Patent Application No. 2007-159223 is incorporated by reference in its entirety.

TECHNICAL FIELD

The present disclosure relates to a method of manufacturing an electronic component integrated substrate, and more particularly to a method of manufacturing an electronic component integrated substrate which comprises the steps of providing an electronic component between a first substrate and a second substrate and sealing the electronic component with a resin.

RELATED ART

At present, a performance of an electronic apparatus using a semiconductor device including an electronic component such as a semiconductor chip is enhanced, and it is required to increase a density in the case in which a semiconductor chip is mounted on a substrate and to reduce a size of the substrate mounting an electronic component, and to achieve space saving.

For this reason, there has been proposed a substrate in which an electronic component such as a semiconductor chip is embedded, that is, a so-called electronic component integrated substrate, and there have been proposed various structures for integrating an electronic component into a substrate.

An example of the electronic component integrated substrate has been disclosed in Patent Document 1, for instance. The electronic component integrated substrate disclosed in the Patent Document 1 has a structure in which a bump functioning as a space is provided between a first mounting substrate and a second mounting substrate and an electronic component is mounted between a pair of substrates separated from each other through the bump. Moreover, the electronic component integrated substrate has a structure in which a sealing resin is provided between the pair of mounting substrates to protect an electronic component.

As a method of manufacturing the electronic component integrated substrate disclosed in the Patent Document 1, moreover, a chip-shaped electronic component is first flip-chip mounted on the first mounting substrate. Subsequently, the bump functioning as the space is soldered to the first mounting substrate. Next, the second mounting substrate is bonded onto the first mounting substrate by using the bump, and furthermore, a resin is filled between the first mounting substrate and the second mounting substrate. Each of the processings is executed to manufacture the electronic component integrated substrate disclosed in the Patent Document 1.

[Patent Document 1] Japanese Patent Application Publication No. 2003-347722 Publication In recent years, however, a requirement for reducing a size and achieving space saving for a substrate mounting an electronic component such as a semiconductor chip has been stricter. Correspondingly, there has been a tendency that a distance between the first mounting substrate and the second mounting substrate is reduced. When the distance between the first mounting substrate and the second mounting substrate is reduced, thus, a flow of the resin between the respective substrates cannot be smoothly carried out and there is a possibility that an air bubble (a void) might be generated in the resin which is formed.

In case of the electronic component integrated substrate, particularly, the electronic component is provided between the first mounting substrate and the second mounting substrate. For this reason, the electronic component is a factor for blocking a flow of the resin. Therefore, there is a problem in that the flow of the resin is defective in the vicinity of the electronic component and the air bubble is easily generated in the vicinity (particularly, an upper part) of the electronic component.

On the other hand, it is possible to propose a formation of a large opening portion in a position of the second substrate which is opposed to the electronic component in order to suppress the generation of the air bubble. Consequently, it is possible to suppose that a flow resistance of the resin in the vicinity of the electronic component is reduced and the air bubble is prevented from being generated.

However, the processing of filling a resin is executed to fill the resin in the portion between the first mounting substrate and the second mounting substrate, thereby enhancing the bonding property of both of the substrates and to correct a warpage generated on the electronic component and the first mounting substrate. More specifically, in the case in which the electronic component is flip-chip mounted on the first mounting substrate and an underfill resin is then filled between the electronic component and the first mounting substrate, there is generated a warpage causing the electronic component and the first mounting substrate to be convexed toward the second mounting substrate by a difference in thermal expansion between the electronic component, the first mounting substrate and the underfill resin.

The warpage is corrected by filling the resin between the first mounting substrate and the second mounting substrate and pressing the electronic component and the first mounting substrate by a filling pressure of the resin in that case. When the large opening portion is formed in the position of the second substrate which is opposed to the electronic component as described above, however, the flow resistance of the resin is reduced to suppress the generation of an air bubble but the filling pressure of the resin is reduced. For this reason, there is a problem in that the warpage generated on the electronic component and the first mounting substrate cannot be corrected.

SUMMARY

Exemplary embodiments of the present invention provide a method of manufacturing an electronic component integrated substrate which can prevent an air bubble from being generated in a resin and can effectively suppress a warpage generated on an electronic component.

A first aspect of the invention is directed to a method of manufacturing an electronic component integrated substrate, comprising:

a first step of mounting, on a first substrate, an electronic component and connecting the electronic component to a wiring formed on the first substrate;

a second step of providing an underfill resin between the electronic component and the first substrate;

a third step of forming at least one hole in a region of a second substrate which is opposed to the electronic component, the second substrate provided with a wiring;

a fourth step of providing an electrode on one of the second substrate and the first substrate;

a fifth step of bonding the electrode to the wiring of the other of the first substrate and the second substrate, thereby bonding the first substrate to the second substrate so as to include the electronic component; and a sixth step of filling a resin between the first substrate and the second substrate so as to apply, to the electronic component and the first substrate, a filling pressure capable of correcting a warpage generated on the electronic component and the first substrate while discharging air from the hole formed on the second substrate.

In the invention, at the sixth step, a film may be provided between the second substrate and a metal mold so as to cover the hole and the first and second substrates which are bonded to each other may be attached to a metal mold, and the resin may be filled in a clearance portion between the first substrate and the second substrate.

In the invention, moreover, the hole may be formed in a central position of the region of the second substrate which is opposed to the electronic component.

In the invention, furthermore, the holes may be provided straight in a filling direction of the resin including a central position of the region of the second substrate which is opposed to the electronic component.

In the invention, moreover, it is also possible to use the electrode including at least a metal core.

In the invention, at the sixth step, the resin may be filled so as to apply, to the electronic component and the first substrate, a filling pressure capable of correcting a warpage generated on the electronic component and the first substrate while discharging air from the hole formed on the second substrate.

According to the invention, at least one hole is formed in the region of the second substrate which is opposed to the electronic component and the resin is filled between the first substrate and the second substrate while the air is discharged from the hole formed on the second substrate. Therefore, it is possible to prevent an air bubble from being generated in the resin.

Moreover, at least one hole is formed in the region of the second substrate which is opposed to the electronic component. Therefore, a diameter (a sectional area) of the hole is smaller than an area of the electronic component. Consequently, a filling pressure capable of correcting a warpage generated on the electronic component and the first substrate can be applied to the resin filled between the first substrate and the second substrate.

Other features and advantages may be apparent from the following detailed description, the accompanying drawings and the claims.

DETAILED DESCRIPTION

Next, the best mode for carrying out the invention will be described with reference to the drawings.

Figure 1:
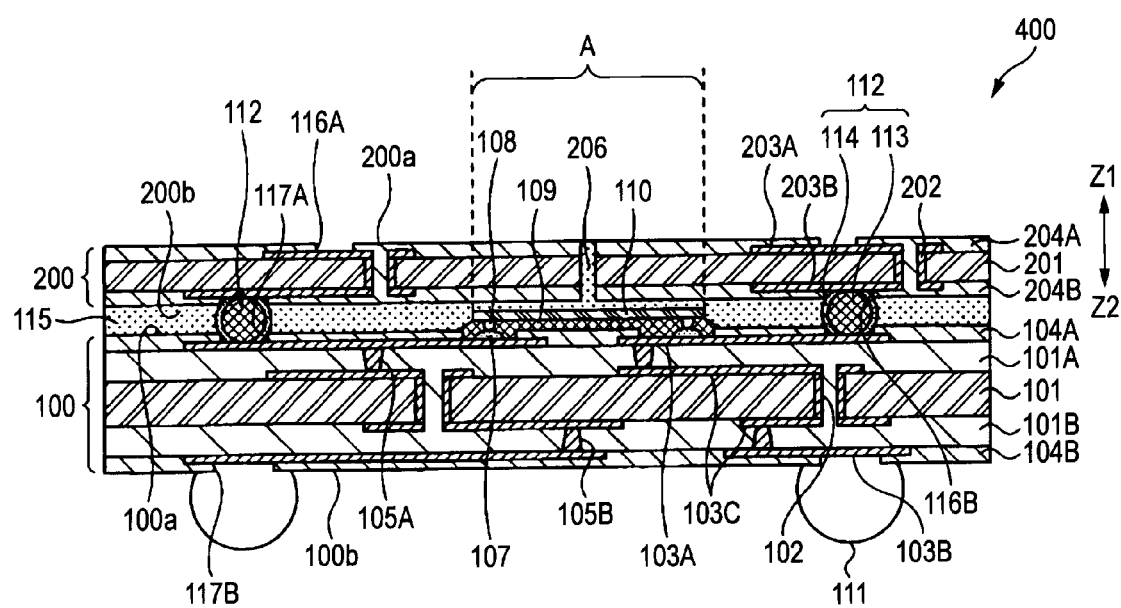
FIG. 1 is a sectional view showing an electronic component integrated substrate according to an embodiment of the invention.

First of all, for convenience of explanation, an electronic component integrated substrate 400 manufactured by a method of manufacturing an electronic component integrated substrate according to the example will be described prior to explanation of the manufacturing method according to the invention. FIG. 1 is a sectional view showing the electronic component integrated substrate 400. In the following description, a side shown in an arrow Z1 is defined to be an upper side and a side shown in an arrow Z2 is defined to be a lower side in FIG. 1, and the same definition will be given to FIG. 2 and succeeding drawings.

The electronic component integrated substrate 400 is schematically constituted by a first substrate 100, a second substrate 200, a semiconductor chip 110 (corresponding to an electronic component according to claims), an electrode 112, and a sealing resin 115.

The first substrate 100 is constituted by a core substrate 101, build-up layers 101A and 101B, wiring patterns 103A and 103B, an inner wiring 103C, and solder resist layers 104A and 104B.

The core substrate 101 is constituted by a prepreg material (a material obtained by impregnating a glass fiber with an epoxy resin), and the inner wiring 103C constituted by Cu is formed on both sides, for example. Moreover, the inner wirings 103C formed on both sides of the core substrate 101 are electrically connected to each other through a via plug 102 formed to penetrate through the core substrate 101.

The core substrate 101 has the buildup layer 101A formed on an upper surface and has the buildup layer 101B formed on a lower surface in the drawing. The wiring pattern 103A constituted by Cu is formed on an upper surface of the buildup layer 101A, for example, and the wiring pattern 103B constituted by Cu is formed on a lower surface of the buildup layer 101B, for example. The wiring pattern 103A is connected to the inner wiring 103C through a via 105A and the wiring pattern 103B is connected to the inner wiring 103C through a via 105B.

Moreover, the solder resist layer 104A is formed on the upper surface of the buildup layer 101A in the drawing. The solder resist layer 104A is provided with a connecting hole 117A (see FIG. 2D) through a removal of a bonding position of the semiconductor chip 110 and the electrode 112 which will be described below. The wiring pattern 103A is maintained in an exposing state from the connecting hole 117A.

Furthermore, the solder resist layer 104B is formed on the lower surface of the buildup layer 101B in the drawing. The solder resist layer 104B is provided with a connecting hole 117B in a position in which a solder ball 111 to be described below is connected. The wiring pattern 103B is maintained in an exposing state from the connecting hole 117B.

For example, a connecting layer constituted by Ni/Au (a layer obtained by providing an Ni layer and an Au layer on the wiring pattern 103A in order) may be formed in order to enhance a soldering property in a position in which the electrode 112 or solder ball 111 to be described below is soldered in the wiring patterns 103A and 103B exposed from the connecting holes 117A and 117B (the connecting layer is not shown). Moreover, a connecting layer 107 constituted by a solder is formed through a printing process or an electrolytic plating process in a position in which the semiconductor chip 110 is flip-chip bonded in the wiring patterns 103A and 103B exposed from the connecting holes 117A and 117B.

The semiconductor chip 110 is mounted on the first substrate 100 through a flip-chip bonding. The semiconductor chip 110 has a bump 108 formed on a main surface thereof. The bump 108 is bonded to the connecting layer 107 so that the semiconductor chip 110 is bonded to the first substrate 100 in face-down.

Moreover, an underfill resin 109 is provided between the semiconductor chip 110 and an upper surface 100a of the first substrate 100 in order to enhance a bonding reliability. However, the underfill resin 109 is provided so that a warpage is generated on the semiconductor chip 110 and the first substrate 100 in some cases as will be described below.

Although there has been described the example in which the semiconductor chip 110 is used as an electronic component in the embodiment, the electronic component is not restricted to the semiconductor chip but other electronic components (for example, a semiconductor chip, a capacitor, a resistor and an inductor) may be used in combination.

The solder ball 111 functions as an external connecting terminal and is provided on a lower surface 100b of the first substrate 100. More specifically, the solder resist layer 104B is provided with the connecting hole 117B from which the wiring pattern 103B is exposed as described above, and the solder ball 111 is bonded to the wiring pattern 103B exposed from the connecting hole 117B.

On the other hand, the second substrate 200 is constituted by a core substrate 201, wiring patterns 203A and 203B, and solder resist layers 204A and 204B.

The core substrate 201 is formed by a prepreg material in the same manner as the core substrate 101 of the first substrate 100 and the wiring patterns 203A and 203B constituted by Cu are formed on upper and lower surfaces thereof, for example. The wiring patterns 203A and 203B are electrically connected to each other through a via plug 202 formed to penetrate through the core substrate 201.

Moreover, the solder resist layers 204A and 204B are formed on upper and lower surfaces of the core substrate 201 provided with the wiring patterns 203A and 203B in the drawing, respectively. The solder resist layer 204B positioned on a lower side is provided with a connecting hole 116B (see FIG. 2A) in a bonding position of the electrode 112 which will be described below.

Furthermore, the wiring pattern 203B is maintained in an exposing state from the connecting hole 116B. Although a connecting hole 116A formed on the solder resist layer 204A at the upper side is provided to mount a surface mounting component or an electronic component or to laminate (stack) a plurality of electronic component integrated substrates 400, it does not need to be always provided if the lamination is not carried out.

In addition, a through hole 206 is formed in a region of the second substrate 200 which is opposed to the semiconductor chip 110. The through hole 206 is formed to penetrate through the second substrate 200 in an opposed position to an almost central position of the semiconductor chip 110. For example, if the thickness of the second substrate 200 is 0.1 mm to 0.15 mm and a diameter of the electrode 112 is 0.2 mm, a diameter of the through hole 206 is selected to be 0.1 mm to 0.2 mm.

The first and second substrates 100 and 200 having the structures are bonded to each other through a seal connecting layer. The seal connecting layer is constituted by the electrode 112 and the sealing resin 115.

The electrode 112 has a structure in which a solder coating 114 is formed on a surface of a spherical copper core 113. The electrode 112 has a lower part soldered to the wiring pattern 103A exposed from the connecting hole 117A of the first substrate 100 and an upper part bonded to the wiring pattern 203B exposed from the connecting hole 116B of the second substrate 200.

Consequently, the wiring pattern 103A of the first substrate 100 and the wiring pattern 203B of the second substrate 200 are bonded electrically and mechanically through the electrode 112. Moreover, the copper core 113 functions as a spacer for maintaining a distance between the first substrate 100 and the second substrate 200 to be constant.

The sealing resin 115 is formed in a portion in which the first and second substrates 100 and 200 are separated from each other and the through hole 206 provided on the second substrate 200 to be described below. The sealing resin 115 also functions as an adhesive. Consequently, the first substrate 100 and the second substrate 200 are firmly bonded to each other through the sealing resin 115. Moreover, the sealing resin 115 is also constituted to be filled in the through hole 206 formed on the second substrate 200.

Thus, the electronic component integrated substrate 400 carries out the bonding through the sealing resin 115 in addition to the bonding to be performed through the electrode 112 in order to bond the first substrate 100 to the second substrate 200. Even if a thickness of the electronic component integrated substrate 400 is reduced, therefore, the first substrate 100 and the second substrate 200 are prevented from being separated from each other but a high reliability can be implemented.

Next, description will be given to the method of manufacturing the electronic component integrated substrate 400 shown in FIG. 1.

FIGS. 2A to 4B are views showing the method of manufacturing the electronic component integrated substrate 400 in accordance with a manufacturing procedure. In FIGS. 2A to 4B, corresponding structures to those shown in FIG. 1 have the same reference numerals and description thereof will be partially omitted.

Figure 2A:
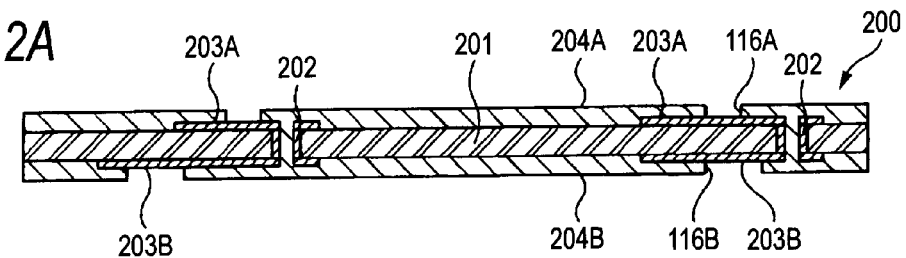
FIGS. 2A to 2E are views (No. 1) for explaining a manufacturing method in the sectional view showing the electronic component integrated substrate according to the embodiment.

In order to manufacture the electronic component integrated substrate 400, first of all, the second substrate 200 shown in FIG. 2A is manufactured. In order to manufacture the second substrate 200, for example, the via plug 202 penetrating through the core substrate 201 is formed on the core substrate 201 constituted by a prepreg material, for example.

Moreover, the wiring pattern 203A is formed on the upper surface of the core substrate 201 (a surface on an opposite side to an opposed surface to the semiconductor chip) and the wiring pattern 203B is formed on the lower surface of the core substrate 201 (the opposed surface to the semiconductor chip). Furthermore, the wiring pattern 203A and the wiring pattern 203B which are formed on the respective surfaces of the core substrate 201 are electrically connected to each other through the via plug 202. The wiring patterns 203A and 203B and the via plug 202 can be formed of Cu, for example.

In addition, the solder resist layer 204A having the connecting hole 116A in a predetermined position is formed on the upper surface of the core substrate 201. For example, a connecting layer formed of Ni/Au may be provided on the wiring pattern 203A exposed from the connecting hole 116A of the solder resist layer 204A.

Similarly, the solder resist layer 204B having the connecting hole 116B in a predetermined position is formed on the lower surface of the core substrate 201. For example, a connecting layer formed of Ni/Au may be provided on the wiring pattern 203B exposed from the connecting hole 116B of the solder resist layer 204B.

When the second substrate 200 shown in FIG. 2A is manufactured, the through hole 206 is subsequently formed on the second substrate 200. For a method of forming the through hole 206, it is possible to utilize machining using a drill or a laser processing using a laser beam, for example. In the case in which the drilling is used, it is possible to reduce a processing cost. In the case in which the laser processing is used, moreover, it is possible to shorten a time required for the processing.

Moreover, it is desirable that a diameter of the through hole 206 should be selected to be 0.2 mm to 1.0 mm, for example. The reason is that the hole diameter is set to enable filling of the sealing resin 115 in the through hole 206 at a step of filling the sealing resin 115 which will be described below.

In the embodiment, furthermore, the through hole 206 is formed in a central position of an opposed region to the semiconductor chip 110 (a region shown in an arrow A of FIG. 1) in the lamination of the second substrate 200 on the first substrate 100.

Figure 2B:
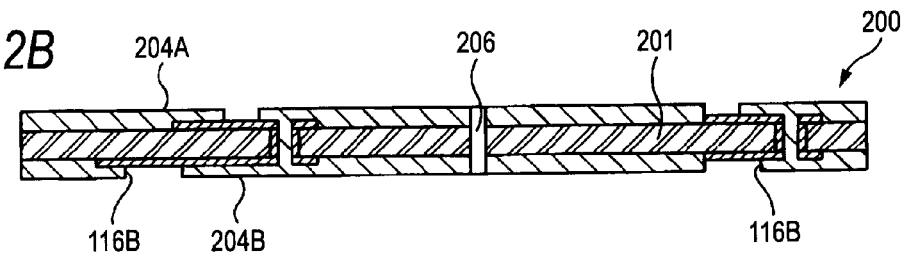

Usually, the wiring pattern 203B is not formed in the opposed region to the semiconductor chip 110 in many cases, and an air bubble 308 is often formed on a center of the semiconductor chip 110 as will be described below. For this reason, it is desirable that the through hole 206 should be formed in a central position in the region of the second substrate 200 which is opposed to the semiconductor chip 110 in respect of a prevention of the generation of the air bubble 308 which will be described below. FIG. 2B shows the second substrate 200 on which the through hole 206 is formed.

When the step of forming the through hole 206 is ended, the electrode 112 is subsequently bonded to the second substrate 200. The electrode 112 has such a structure that the solder coating 114 is provided on an outer periphery of the spherical copper core 113 as described above.

Figure 2C:
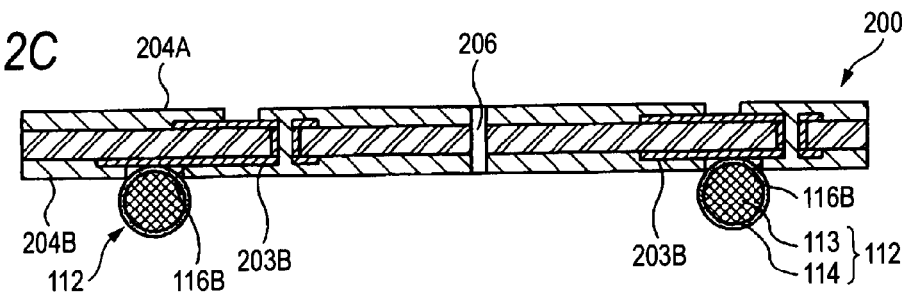

In order to bond the electrode 112 to the second substrate 200, a flux is applied to the electrode 112, and furthermore, the electrode 112 is temporarily fixed to the wiring pattern 203B exposed from the connecting hole 116B. Subsequently, the second substrate 200 having the electrode 112 fixed temporarily is subjected to a reflow treatment so that the electrode 112 is soldered to the wiring pattern 203B. When the soldering step is ended, flux cleaning is carried out to remove a flux residue. FIG. 2C shows the second substrate 200 to which the electrode 112 is soldered.

Figure 2D:
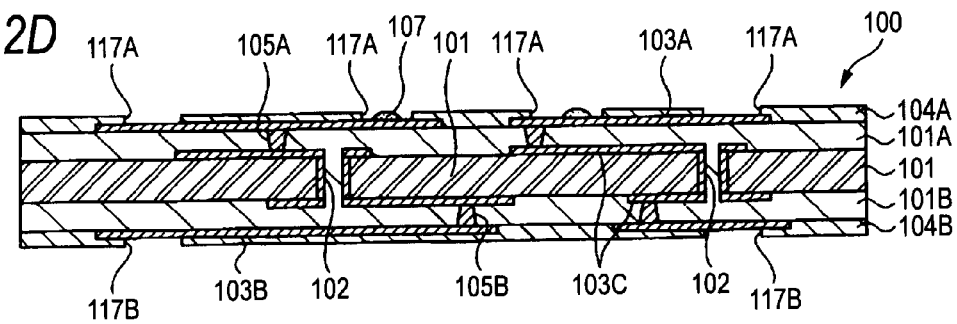

On the other hand, in order to manufacture the electronic component integrated substrate 400, the first substrate 100 shown in FIG. 2D is manufactured. In order to manufacture the electronic component integrated substrate 400, the core substrate 101 formed by a prepreg material is prepared, for example, and the via plug 102 penetrating through the core substrate 101 is formed and the inner wiring 103C is formed on the upper and lower surfaces of the core substrate 101. The inner wirings 103C formed on the upper and lower surfaces of the core substrate 101 are electrically connected to each other through the via plug 102. The via plug 102 and the inner wiring 103C can be formed of Cu, for example.

Subsequently, the buildup layer 101A is formed on the upper surface of the core substrate 101 on which the inner wiring 103C is formed, and furthermore, the buildup layer 101B is formed on the lower surface of the core substrate 101. For the buildup layers 101A and 101B, it is possible to use an insulating film formed by an epoxy resin or a polyimide resin, for example.

Next, the wiring pattern 103A is formed on the upper surface of the buildup layer 101A. The wiring pattern 103A and the inner wiring 103C are electrically connected to each other through the via 105A formed to penetrate through the buildup layer 101A. Moreover, the wiring pattern 103B is formed on the lower surface of the buildup layer 101B. The wiring pattern 103B and the inner wiring 103C are electrically connected to each other through the via 105B formed to penetrate through the buildup layer 101B.

Subsequently, the solder resist layer 104A is formed on the upper surface of the buildup layer 101A on which the wiring pattern 103A is formed. When forming the solder resist layer 104A, the connecting hole 117A is formed in a position in which the semiconductor chip 110 is bonded and a position in which the electrode 112 is bonded as will be described below. Moreover, a connecting layer formed of Ni/Au may be provided on the wiring pattern 103A exposed from the connecting hole 117A, for example.

Moreover, the connecting layer 107 constituted by a solder, for example, is formed through a printing process or an electrolytic plating process on the wiring pattern 103A exposed from any of the formed connecting holes 117A to which the semiconductor chip 110 is bonded at a subsequent step.

On the other hand, the solder resist layer 104B is formed on the lower surface of the buildup layer 101B on which the wiring pattern 103B is formed. When forming the solder resist layer 104B, the connecting hole 117B is formed in the position in which the solder ball 111 is bonded as will be described below. Moreover, a connecting layer constituted by Ni/Au, for example, may be formed on the wiring pattern 103B exposed from the connecting hole 117B.

Subsequently, the semiconductor chip 110 is mounted on the first substrate 100 manufactured as described above. In order to mount the semiconductor chip 110 on the first substrate 100, the bump 108 is previously provided on the main surface of the semiconductor chip 110 and the semiconductor chip 110 is set to be face-down, and the bump 108 formed on the main surface is bonded to the connecting layer 107.

When the semiconductor chip 110 is flip-chip bonded to the first substrate 100, the underfill 109 is subsequently filled between the semiconductor chip 110 and the first substrate 100 (the upper surface 100a) and a heat treatment is then carried out to thermally cure the underfill resin 109. Consequently, the semiconductor chip 110 is bonded to the first substrate 100 with a high reliability.

Figure 2E:
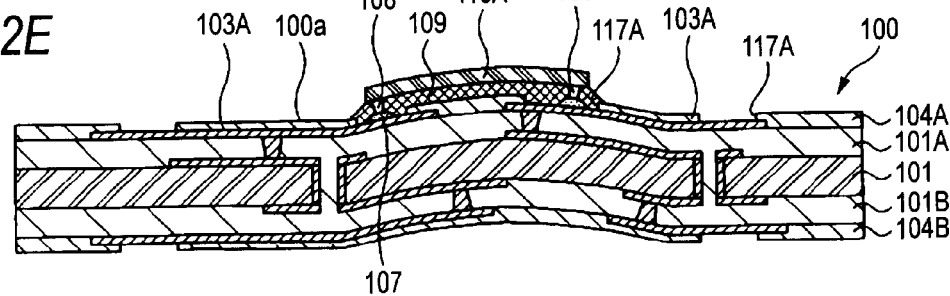

However, each material constituting the first substrate 100, silicon constituting the semiconductor chip 110 and the underfill resin 109 have different coefficients of thermal expansion. In the heat treatment for the underfill resin 109, therefore, a warpage is generated on the semiconductor chip 110 and the first substrate 100 due to a difference in the coefficient of thermal expansion. FIG. 2E shows a state in which the warpage is generated on the semiconductor chip 110 and the first substrate 100. As shown in FIG. 2E, the warpage is generated to be upward convex.

Both the manufacturing process for the second substrate 200 described with reference to FIGS. 2A to 2C and the manufacturing process for the first substrate 100 described with reference to FIGS. 2D and 2E may be executed earlier or at the same time.

Figure 3A:
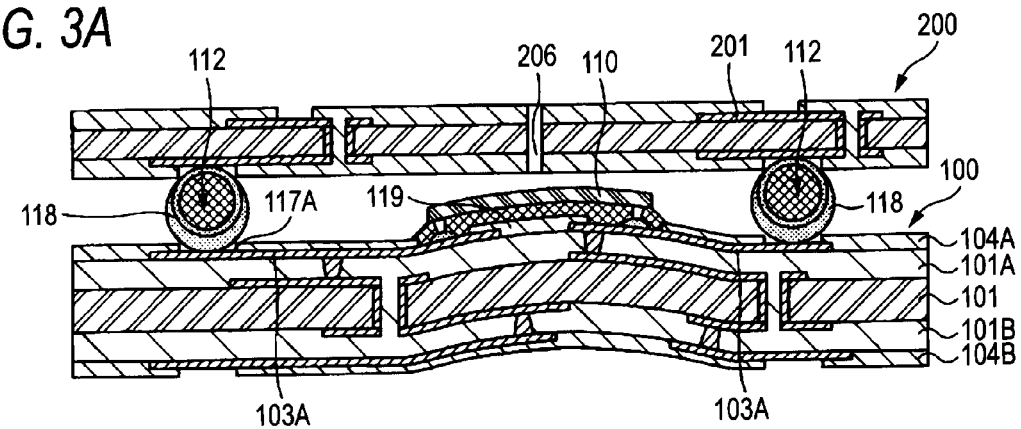
FIGS. 3A to 3C are views (No. 2) for explaining the manufacturing method in the sectional view showing the electronic component integrated substrate according to the embodiment.
Figure 3B:
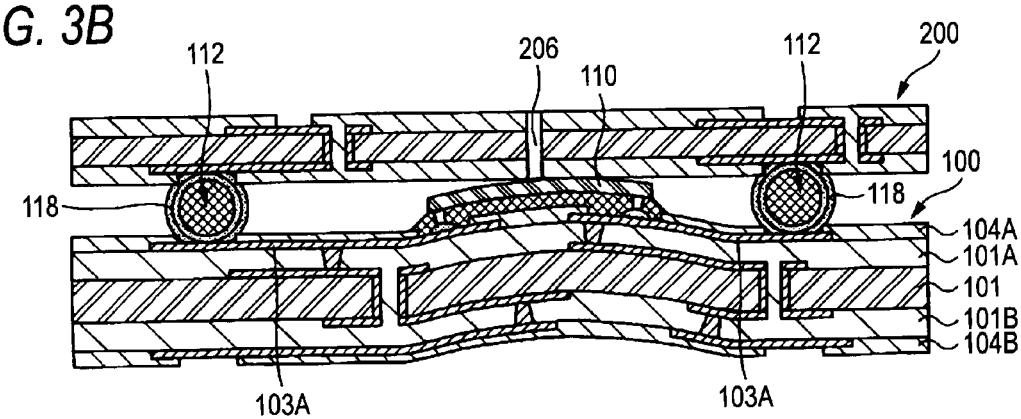
Figure 3C:
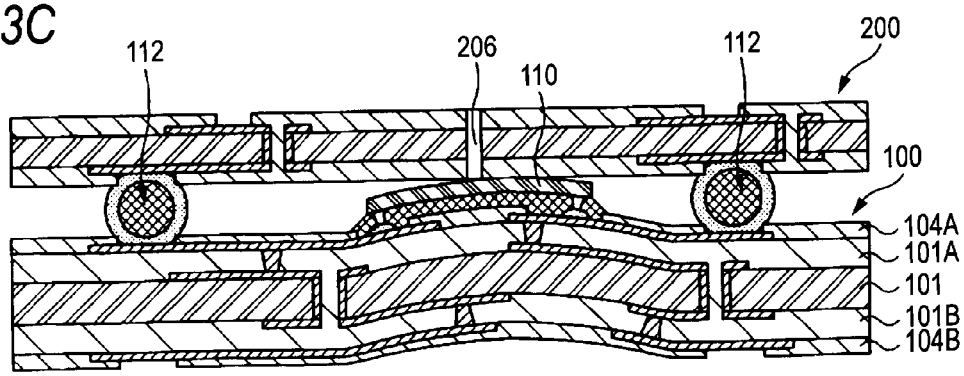

When the first substrate 100 and the second substrate 200 are manufactured as described above, the step of bonding the second substrate 200 to the first substrate 100 is subsequently carried out as shown in FIGS. 3A to 3C. In FIGS. 3A to 3C, the electrode 112 is drawn to be larger than that in the other structures for convenience of illustration.

In order to bond the second substrate 200 to the first substrate 100, a flux 118 is first applied to the electrode 112, and furthermore, the second substrate 200 is positioned above the first substrate 100 in such a manner that the through hole 206 is opposed to the semiconductor chip 110 and the electrode 112 is opposed to the connecting hole 117A. FIG. 3A shows a state in which the positioning is carried out. In this state, the through hole 206 is maintained to be opposed to an almost central position of the semiconductor chip 110 (a central position of the semiconductor chip 110 seen on a plane)

Subsequently, the second substrate 200 is caused to abut on the first substrate 100. Consequently, the electrode 112 is maintained to be temporarily fixed to the wiring pattern 103A with the flux 118. When the second substrate 200 is temporarily fixed to the first substrate 100, thus, the first and second substrates 100 and 200 are attached to a reflow furnace to execute a heating step while maintaining the temporary fixing state.

Consequently, the solder coating 114 of the electrode 112 is molten and soldered to the wiring pattern 103A so that the first substrate 100 and the second substrate 200 are bonded and laminated through the electrode 112. FIG. 3B shows a state in which the first substrate 100 and the second substrate 200 are bonded to each other through the electrode 112. In this case, the semiconductor chip 110 and the first substrate 100 are set in a warping state as described above. Therefore, the upper surface of the semiconductor chip 110 and the lower surface of the second substrate 200 abut on each other or have a slight gap.

Subsequently, there is carried out a cleaning step of removing a flux residue which remains in the soldering position of the electrode 112. FIG. 3C shows a state in which the cleaning step is carried out so that the flux residue is removed.

Subsequently, the first and second substrates 100 and 200 subjected to the cleaning step are attached into a metal mold 300 (see FIG. 6) and a transfer molding step of molding the sealing resin 115 is executed. A step of filling the sealing resin 115 between the first substrate 100 and the second substrate 200 will be described below in detail for convenience of explanation.

Figure 4A:
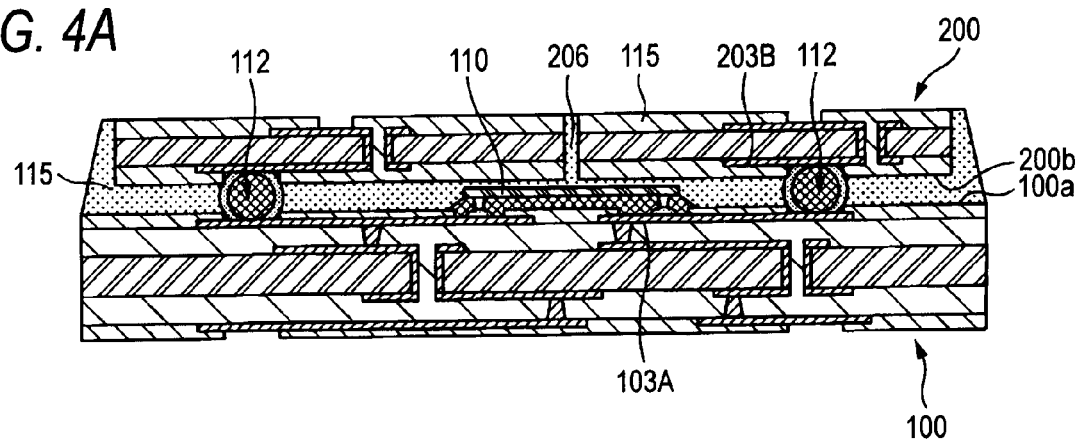
FIGS. 4A and 4B are views (No. 3) for explaining the manufacturing method in the sectional view showing the electronic component integrated substrate according to the embodiment.

When the transfer molding for the sealing resin 115 is ended, the first and second substrates 100 and 200 on which the sealing resin 115 is formed are taken out of the metal mold 300. FIG. 4A shows the first and second substrates 100 and 200 on which the sealing resin 115 is formed.

Figure 4B:
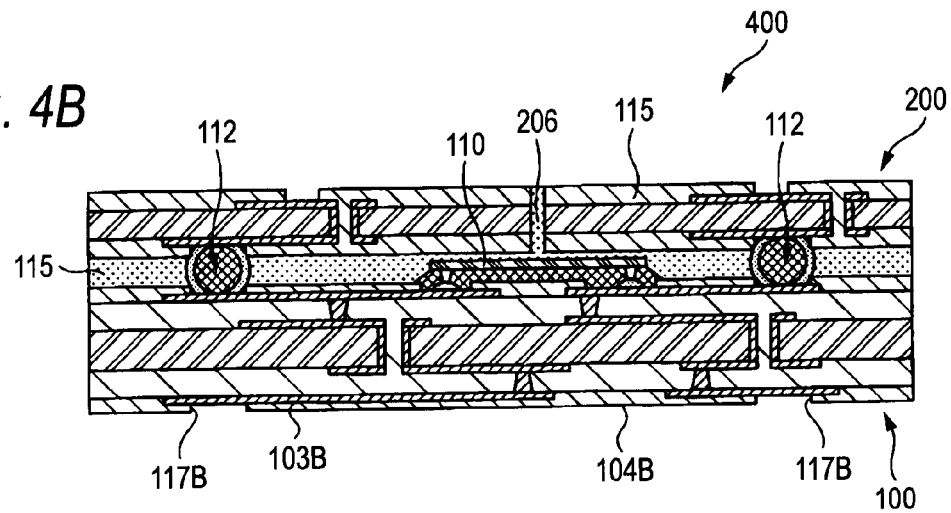

After the sealing resin 115 is formed as described above, a division into individual pieces is carried out and an unnecessary portion is removed. Thus, the electronic component integrated substrate 400 shown in FIG. 4B is manufactured. In the individual piece division processing, the second substrate 200 is set to be a substrate which is an individual piece and the first substrate 100 is set to be a so-called multi-cavity piece in the example as shown in FIG. 4A.

Although FIG. 4A shows a state in which only one second substrate 200 is bonded to the upper part of the first substrate 100 for convenience of illustration, accordingly, a plurality of second substrates 200 is actually bonded to the upper part of the first substrate 100 and a processing of cutting them every electronic component integrated substrate 400 is carried out.

However, the structure related to the division into individual pieces of the respective substrates 100 and 200 is not restricted to the example but the first substrate 100 positioned on an upper side may be set to be a multi-cavity substrate and the second substrate 200 positioned on a lower side may be set to be a substrate which is to be divided into individual pieces or both of the substrates 100 and 200 positioned vertically may be set to be multi-cavity substrates.

When the individual piece division processing is ended, the solder ball 111 is soldered to the wiring pattern 103B exposed from the connecting hole 117B formed on the solder resist layer 104B if necessary so that the electronic component integrated substrate 400 shown in FIG. 1 is manufactured.

With reference to FIGS. 5A to 10, the step of filling the sealing resin 115 between the first substrate 100 and the second substrate 200 will be described in detail. In FIGS. 5A to 10, corresponding structures to those shown in FIGS. 1 to 4B have the same reference numerals and description thereof will be omitted. In FIGS. 5A to 10, moreover, the first substrate 100, the second substrate 200, the semiconductor chip 110 and the electrode 112 are simplified for easy understanding.

Figure 5A:
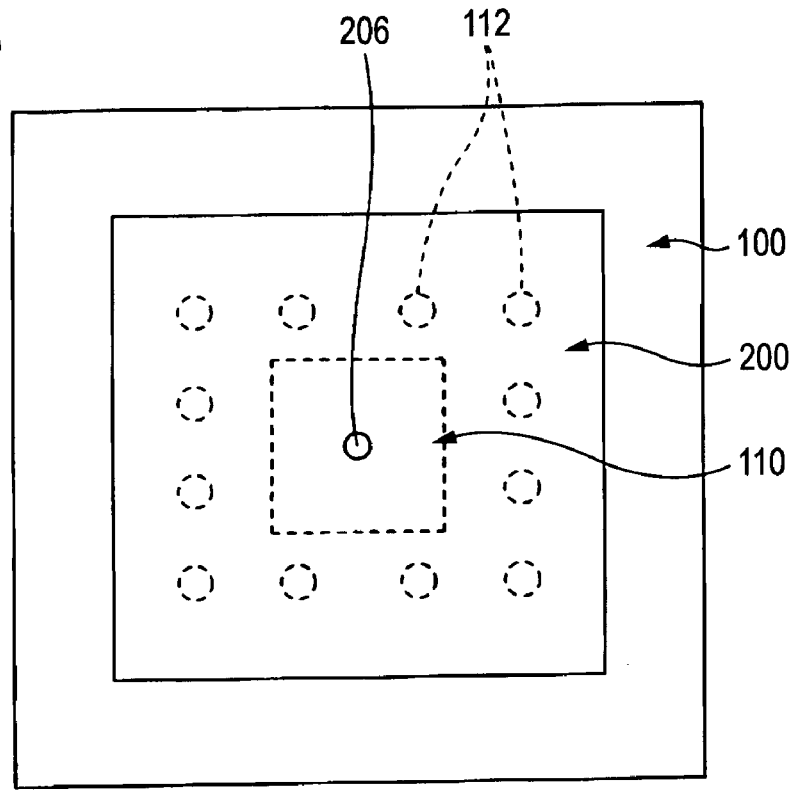
FIGS. 5A to 5C are views for explaining a reason why a warpage is generated on a semiconductor chip and a first substrate.
Figure 5B:
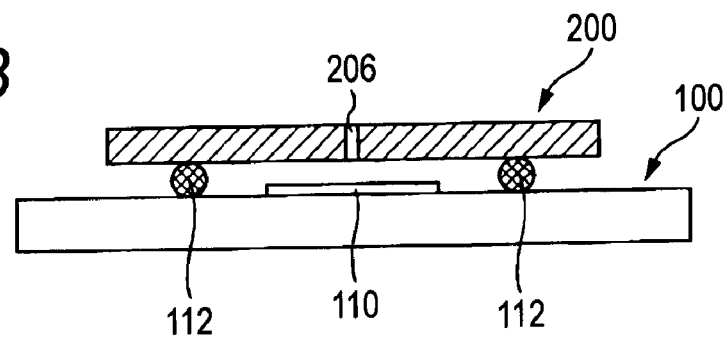
Figure 5C:
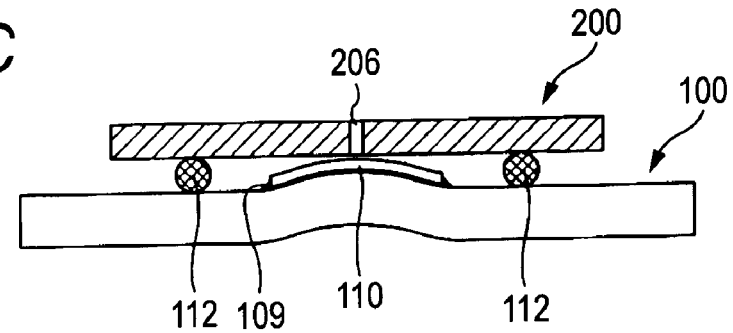

FIGS. 5A to 5C show a state in which the second substrate 200 is laminated on the first substrate 100. FIGS. 5A and 5B show a state in which a warpage is not generated on the first substrate 100 and the semiconductor chip 110. In order to bond the second substrate 200 to the upper part of the first substrate 100, it is desirable that the first substrate 100 and the semiconductor chip 110 should take flat shapes having no warpage as shown in FIGS. 5A and 5B.

On the other hand, in the case in which the semiconductor chip 110 is flip-chip bonded to the first substrate 100, it is necessary to dispose the underfill resin 109 in order to enhance the bonding reliability of the semiconductor chip 110 and the first substrate 100. In the case in which the underfill resin 109 is provided, however, the warpage is generated on the semiconductor chip 110 and the first substrate 100 as shown in FIG. 5C due to a difference in thermal expansion between the first substrate 100, the semiconductor chip 110 and the underfill resin 109 as described above.

Figure 6:
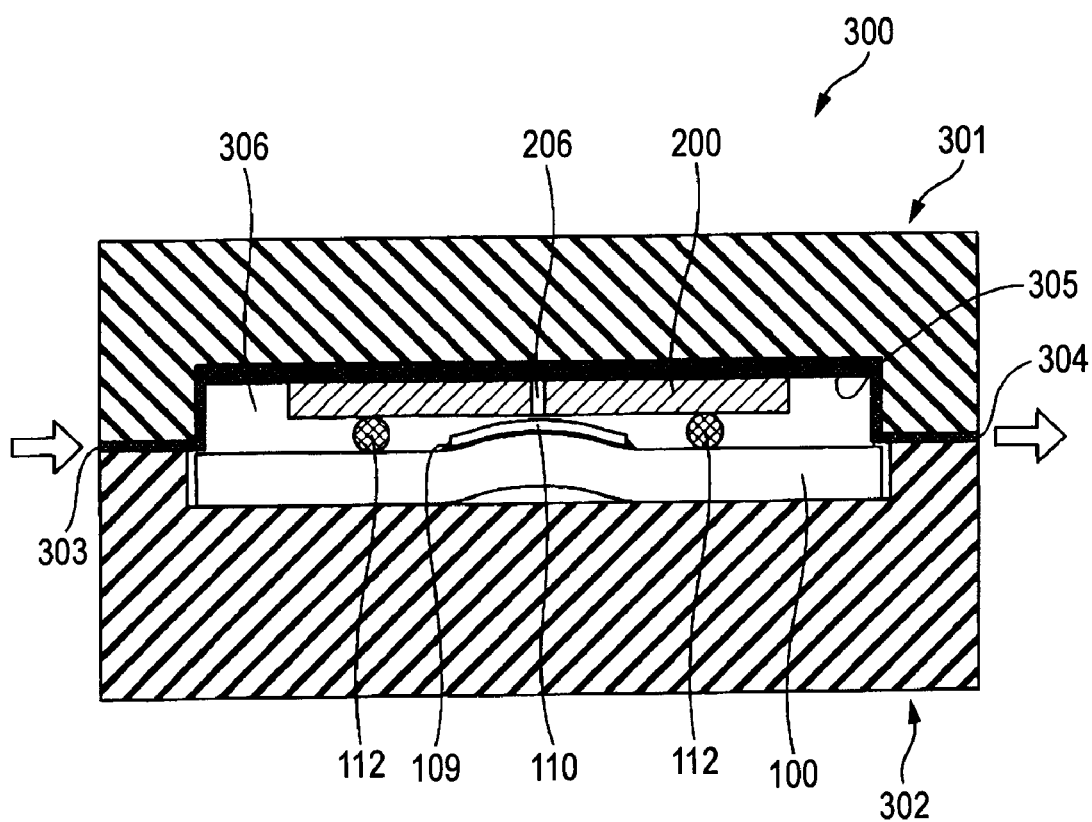
FIG. 6 is a view (No. 1) for explaining a step of filling a sealing resin in detail.

FIG. 6 shows a state in which the first and second substrates 100 and 200 shown in FIG. 5C are attached to the metal mold 300. The metal mold 300 is constituted by an upper mold 301 and a lower mold 302, and the first and second substrates 100 and 200 laminated in a cavity 306 formed between the upper mold 301 and the lower mold 302 are attached thereto.

Moreover, a mold releasing film 305 is provided on an inside surface of the upper mold 301 in order to enhance a mold releasing property after the resin molding. The upper surface of the second substrate 200 is constituted to abut on the mold releasing film 305 in an attaching state to the metal mold 300. Accordingly, the through hole 206 formed on the second substrate 200 is maintained to be blocked with the mold releasing film 305.

Furthermore, the metal mold 300 used in the example has a structure in which the sealing resin 115 is filled through a gate 303 provided on a left side in the drawing, and a vent hole 304 is provided in a position on an opposite side to the gate 303 in the metal mold 300. The vent hole 304 is connected to a sucking device, and therefore, has a structure in which a processing of molding the sealing resin 115 is carried out while air in the cavity 306 is sucked through the vent hole 304.

In the example, thus, a negative pressure is applied into the cavity 306 through the suction in the injection of the sealing resin 115 into the metal mold 300 in the molding. Also in the case in which a distance between the first substrate 100 and the second substrate 200 is small, therefore, it is possible to reliably fill the sealing resin 115 between the respective substrates 100 and 200.

Figure 7A:
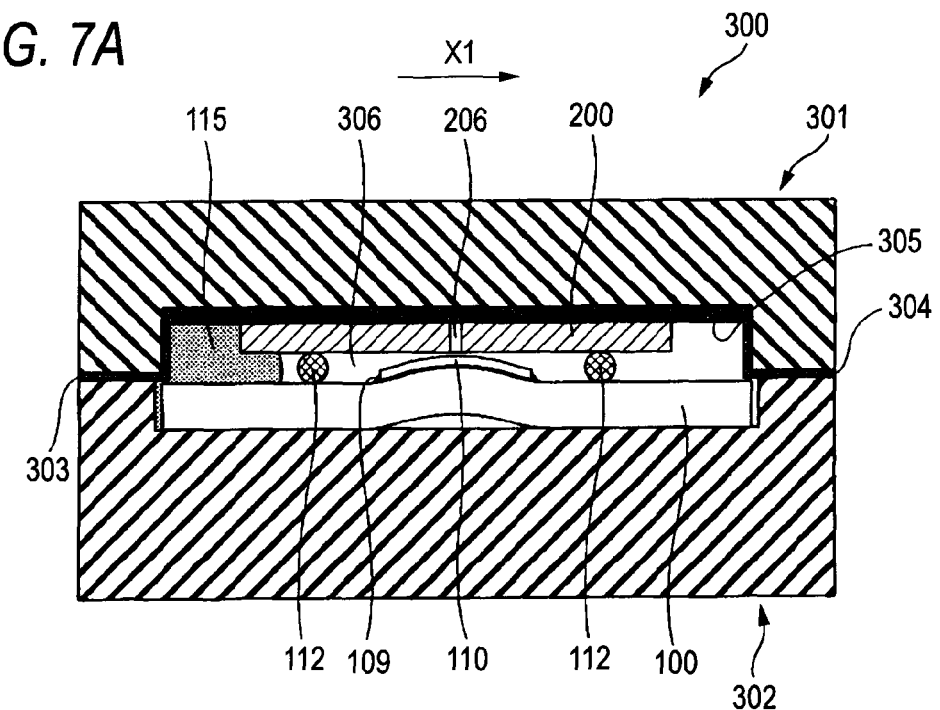
FIGS. 7A and 7B are views (No. 2) for explaining the step of filling a sealing resin in detail.
Figure 7B:
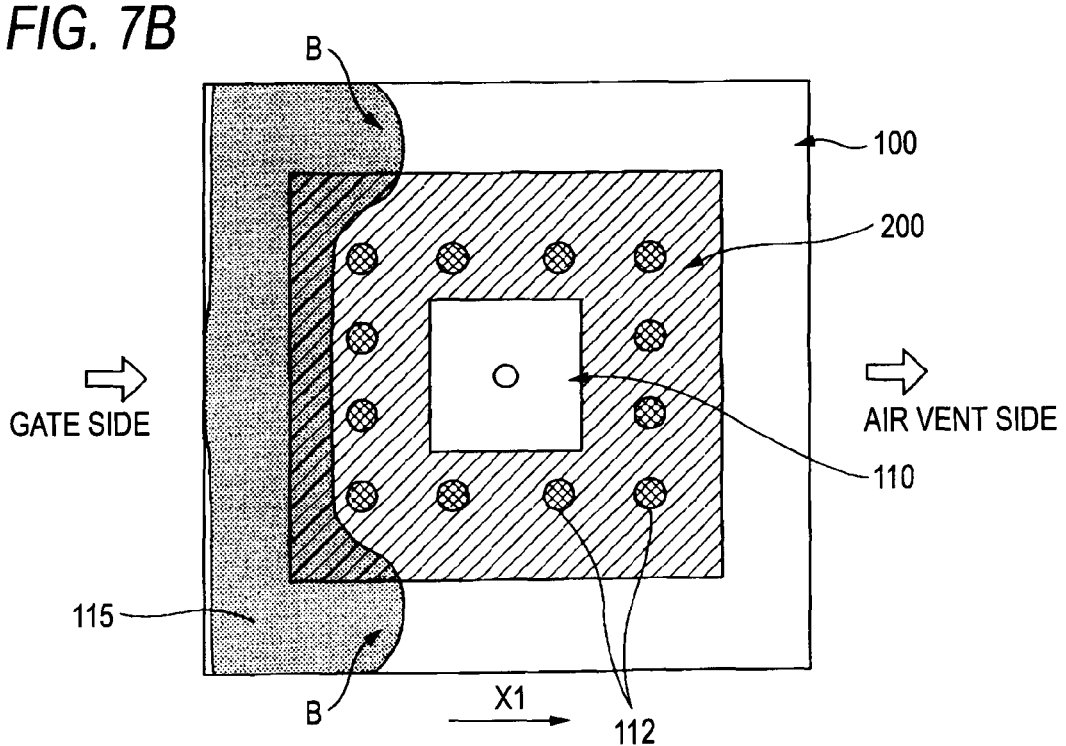
Figure 8A:
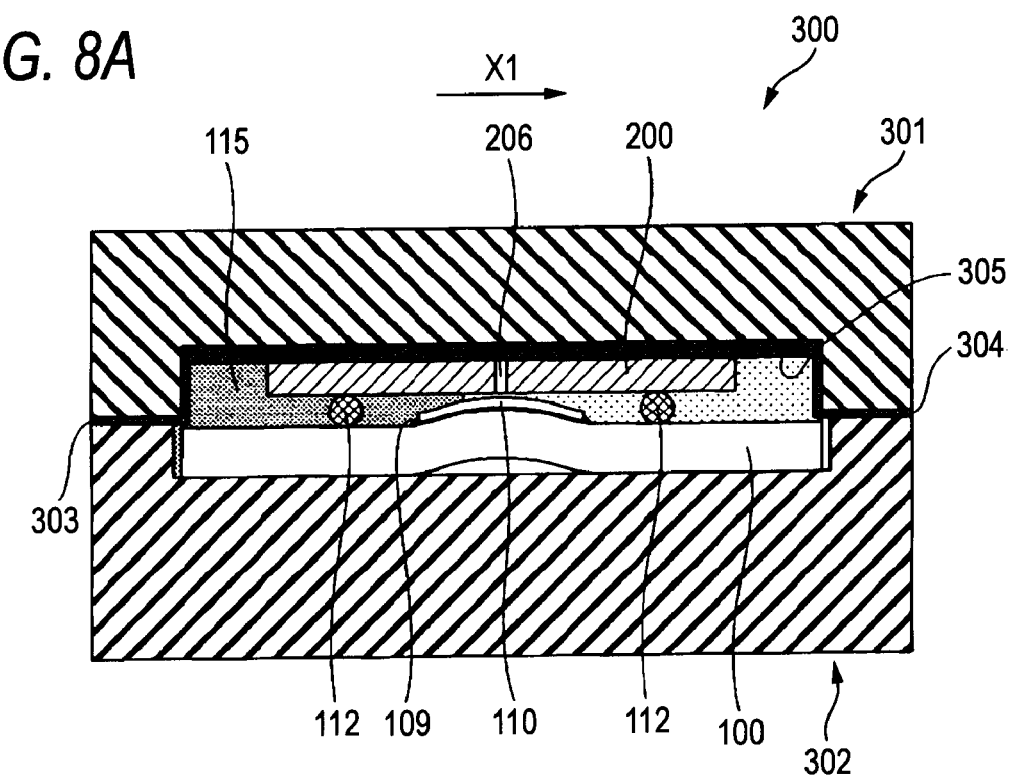
FIGS. 8A and 8B are views (No. 3) for explaining the step of filling a sealing resin in detail.

FIGS. 7A and 7B show an initial state of the filling processing which is brought shortly after the sealing resin 115 is started to be filled (which will be hereinafter referred to as an initial filling state). FIGS. 7A, 8A and 9A to be used in the following description are sectional views showing the metal mold 300 and FIGS. 7B, 8B and 9B are perspective views showing a flow of the sealing resin 115 (the metal mold 300 is not shown).

In the initial filling state shown in FIG. 7A, the sealing resin 115 is advanced almost straight in a direction from the gate 303 toward the vent hole 304 (a direction of an arrow X1). However, the sealing resin 115 is advanced more quickly at both upper and lower sides in FIG. 7B which have low fluid resistances (a portion shown in an arrow of B in FIG. 7B) than a center.

Figure 8B:
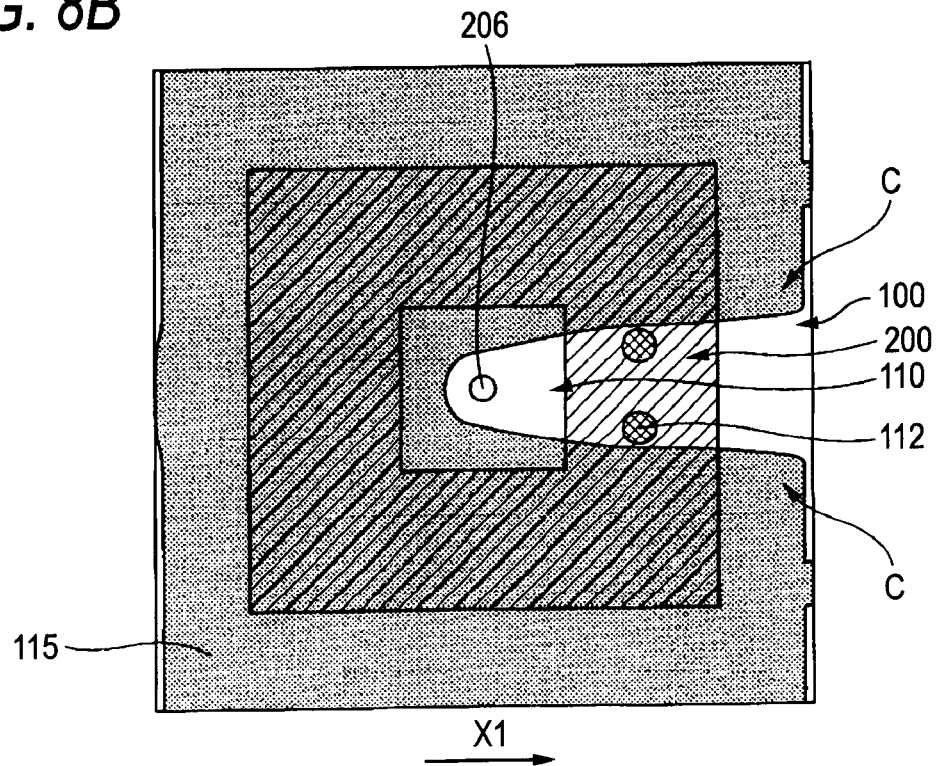
Figure 9A:
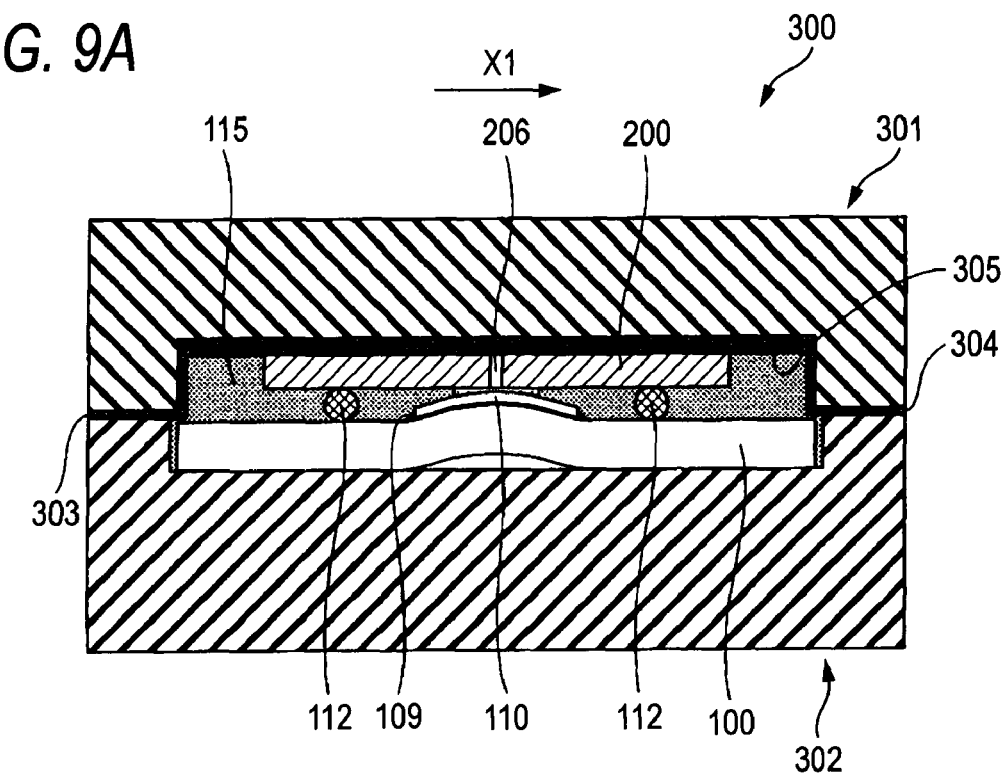
FIGS. 9A and 9B are views (No. 4) for explaining the step of filling a sealing resin in detail.
Figure 9B:
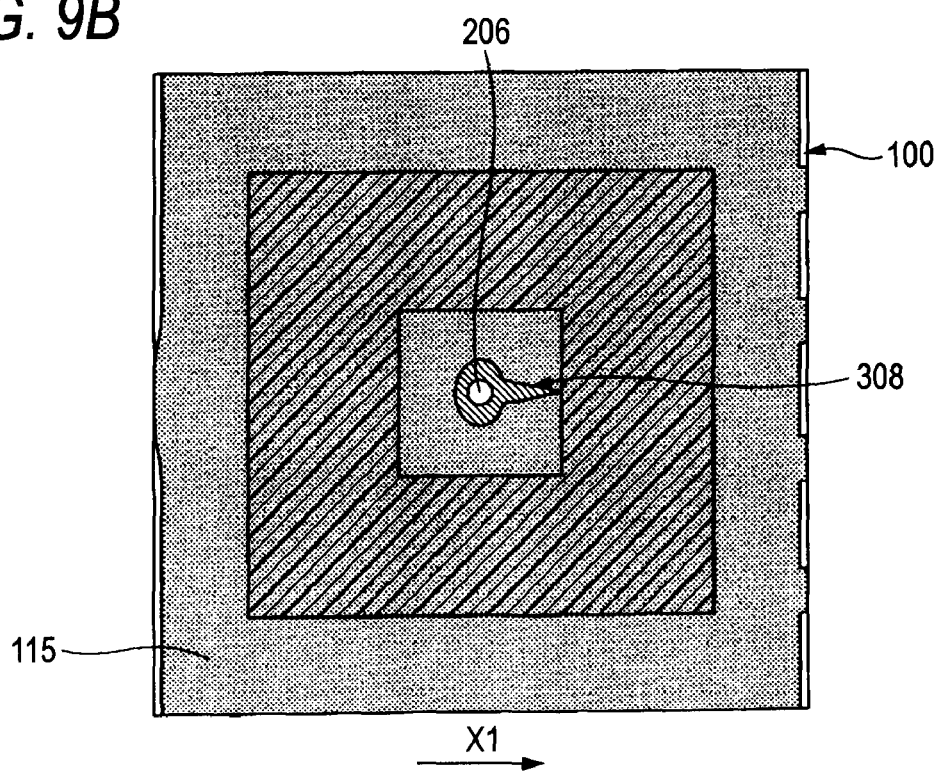

FIGS. 8A and 8B show a state in which the sealing resin 115 is filled more greatly than the initial filling state (which will be hereinafter referred to as an intermediate filling state). In the intermediate filling state, a great difference is made between a moving distance of the sealing resin 115 in a central part and that of the sealing resin 115 in upper and lower parts in FIG. 7B. The reason is that the semiconductor chip 110 is provided in a central position between the respective substrates 100 and 200 and serves as a resistor to the flow of the sealing resin 115.

As described above, furthermore, the warpage is generated on the semiconductor chip 110 and the first substrate 100, and the semiconductor chip 110 almost abuts on the second substrate 200 or a slight gap is formed depending on a position in which the warpage is generated. For this reason, an advancing speed of the sealing resin 115 is low in the central position of each of the substrates 100 and 200. Moreover, the air in the cavity 306 is discharged from the vent hole 304 to an outside in accordance with the advancement of the sealing resin 115 into the metal mold 300.

FIGS. 9A and 9B show a state in which the sealing resin 115 is filled more greatly than in the intermediate filling state (which will be hereinafter referred to as an end filling state). In the end filling state, a portion shown in an arrow of C goes around and is thus integrated in the intermediate filling state shown in FIG. 8B, resulting in a state in which the air bubble 308 is formed therein. The air bubble 308 is generated by the wraparound of the sealing resin 115. Therefore, the air bubble 308 is easily generated in the upper part of the semiconductor chip 110 to be a resistor to the flow of the sealing resin 115. For this reason, the air bubble 308 is formed in the vicinity of the central position of the semiconductor chip 110 also in FIG. 9B.

In the related art, there has not been a method of removing the air bubble 308 formed with the advancement of the sealing resin 115 if any. In the case in which a heat treatment is carried out over the electronic component integrated substrate 400 in a state in which the air bubble 308 is present between the first substrate 100 and the second substrate 200, there is caused a disadvantage that the air bubble 308 expands to separate the first substrate 100 from the second substrate 200.

In the embodiment of the invention, however, the through hole 206 is formed in the central position of the region of the second substrate 200 which is opposed to the semiconductor chip 110. The air to be the air bubble 308 is discharged to the outside of the metal mold 300 via the through hole 206 with the advancement of the sealing resin 115.

More specifically, the air bubble 308 is pushed by the sealing resin 115 and enters the through hole 206 with the advancement of the sealing resin 115. Furthermore, the sealing resin 115 enters the through hole 206 to further press the air bubble 308.

Figure 10:
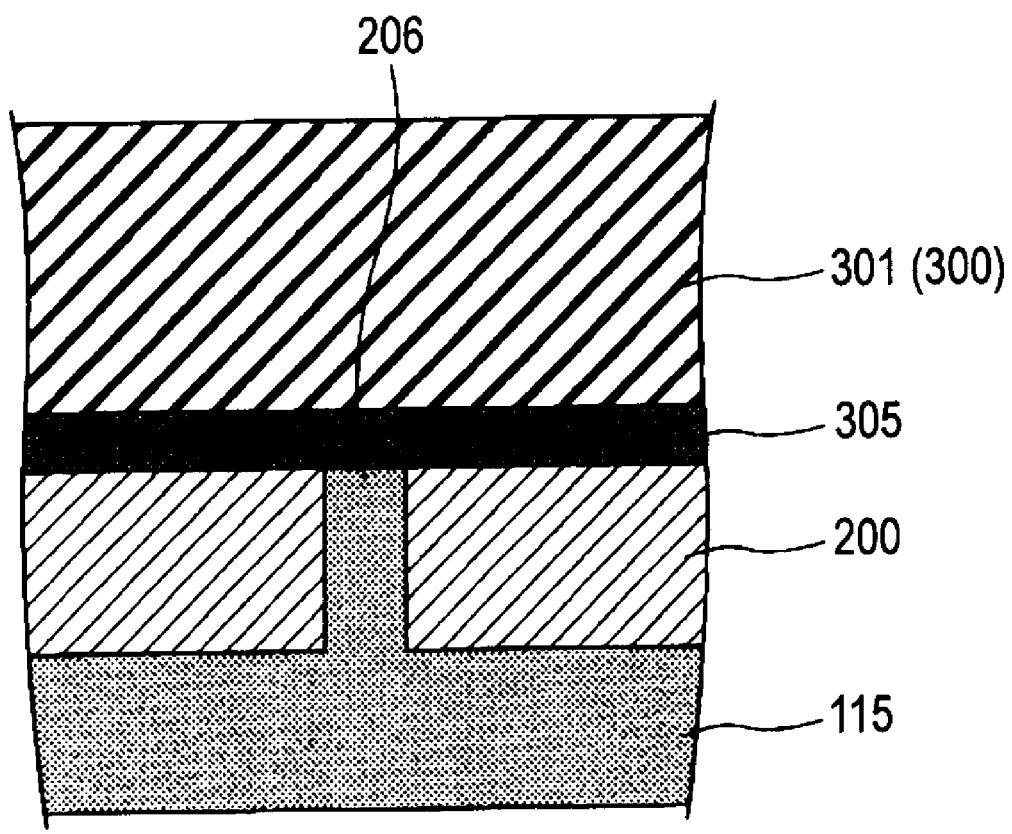
FIG. 10 is a view showing an enlarged position in which a through hole and a mold releasing film are provided in contact with each other.

As shown in an enlarged view of FIG. 10, the mold releasing film 305 is provided between the through hole 206 and the upper mold 301. Accordingly, the air bubble 308 pressed by the sealing resin 115 is advanced into a fine gap between the second substrate 200 and the mold releasing film 305. On the other hand, the sealing resin 115 contains a filler and cannot be advanced into the fine gap between the second substrate 200 and the mold releasing film 305. Accordingly, the flow of the sealing resin 115 is stopped when the through hole 206 is filled, and furthermore, the air bubble 308 is removed from the inside of the sealing resin 115 in this state.

On the other hand, the sealing resin 115 advanced in the cavity 306 of the metal mold 300 presses the semiconductor chip 110 and the first substrate 100 by a filling pressure thereof when it is to be filled in the cavity 306. The filling pressure implies an internal pressure generated in the cavity 306 by filling the sealing resin 115 in the cavity 306 through the gate 303.

When the filling pressure is higher, accordingly, the semiconductor chip 110 and the first substrate 100 are pressed more strongly and the warpage is corrected effectively. In the example, the diameter of the through hole 206 is selected to be 0.2 mm to 1.0 mm. In the through hole 206 having the diameter, a change in the pressure generated in the filling pressure is very small.

Even if the through hole 206 is formed on the second substrate 200, accordingly, the semiconductor chip 110 and the first substrate 100 can be reliably pressed by the sealing resin 115. As shown in FIGS. 4A and 4B, therefore, the semiconductor chip 110 and the first substrate 100 are returned into a flat state when the processing of filling the sealing resin 115 is ended. Consequently, there is no disadvantage in the processing of forming the solder ball 111 which is to be subsequently carried out and the processing of mounting the electronic component integrated substrate 400 which is manufactured.

According to the method of manufacturing the electronic component integrated substrate 400 in accordance with the example as described above, it is possible to prevent the air bubble 308 from being generated in the sealing resin 115 and to reliably correct the warpage of the semiconductor chip 110 and the first substrate 100.

While the preferred examples according to the invention have been described above in detail, the invention is not restricted to the specific embodiment but various modifications and changes can be made without departing from the scope of the invention described in the claims.

Figure 11A:
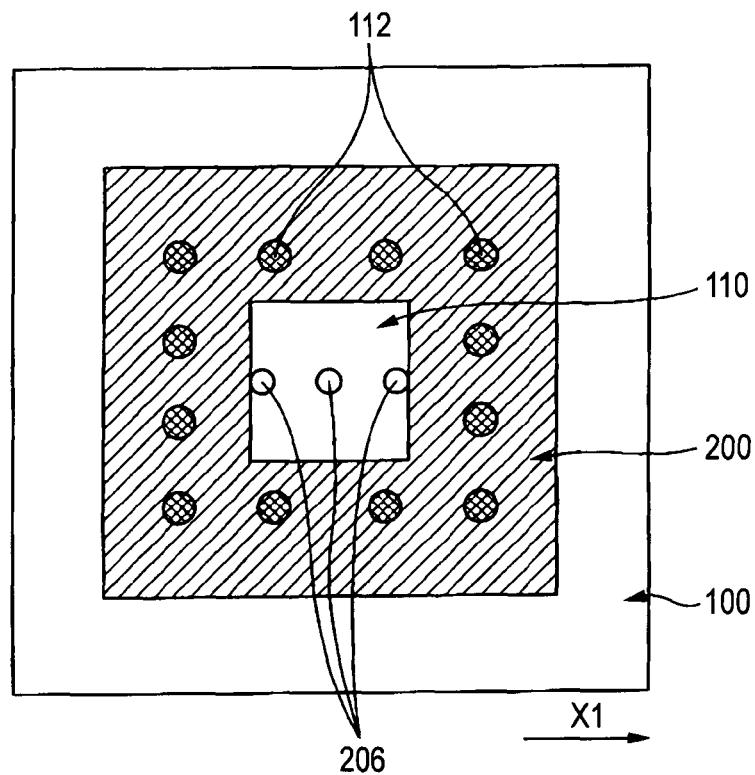
FIGS. 11A and 11B are views for explaining a variant of a through hole to be formed on a second substrate.
Figure 11B:
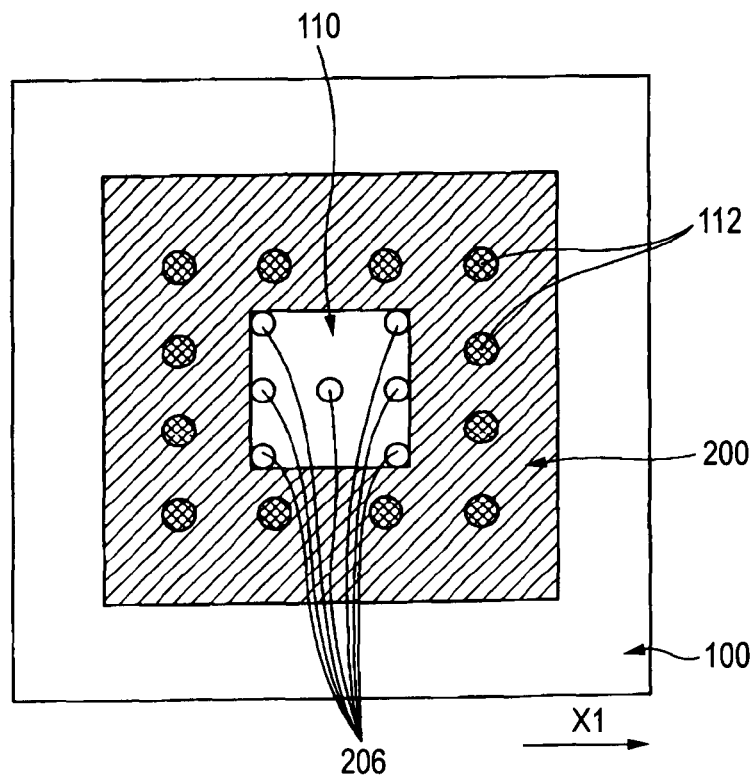
Figure 12:
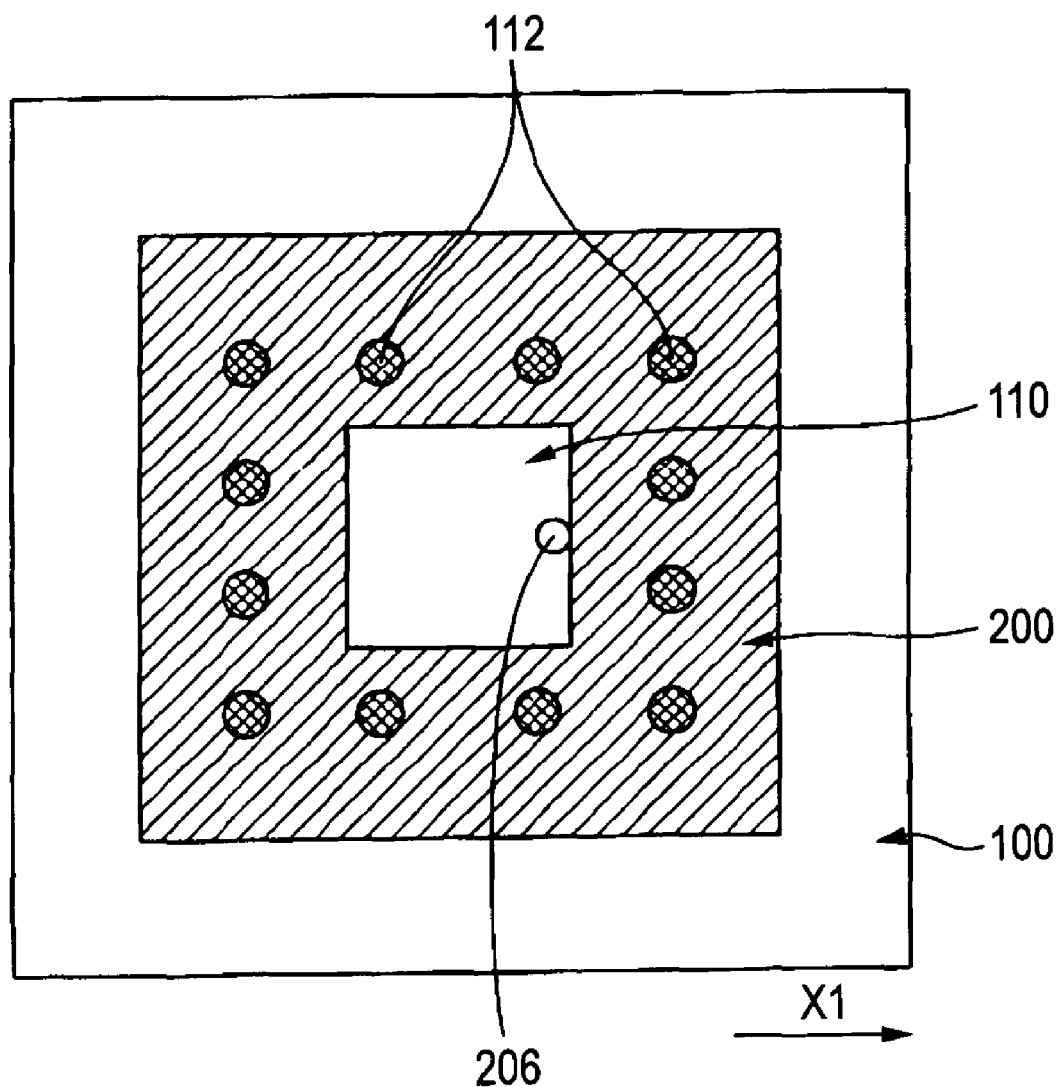
FIG. 12 is a view for explaining a variant of a through hole to be formed on a second substrate.

Although only one through hole 206 is provided in the position of the second substrate 200 which is opposed to the almost central position of the semiconductor chip 110 in the examples, for instance, the through hole 206 is not restricted to the structure but other structures can also be employed. For example, as shown in FIG. 11A, a plurality of (three in an example shown in the drawing) through holes 206 may be provided straight in the filling direction (the X1 direction) of the sealing resin 115 in a region of the second substrate 200 which is opposed to the semiconductor chip 110 including a central position thereof. Moreover, it is also possible to employ a structure in which a plurality of (seven in an example shown in the drawing) through holes 206 is provided to take an H shape in the region of the second substrate 200 which is opposed to the semiconductor chip 110 including the central position as shown in FIG. 11B. Further, the through hole 206 is not restricted to be provided in the central position of the second substrate 200. For example, as shown in FIG. 12, one or more through holes 206 may be provided along the filling direction of the sealing resin 115 in a region of the second substrate 200 which is opposed to the semiconductor chip 110. If the through hole 206 is provided in the downstream of the filling direction of the sealing resin 115 as shown in FIG. 12, there is an advantage that the air bubble is ease to be removed.

What is claimed is:

1. A method of manufacturing an electronic component integrated substrate, comprising:
    a first step of mounting, on a first substrate, an electronic component and connecting the electronic component to a wiring formed on the first substrate;
    a second step of providing an underfill resin between the electronic component and the first substrate;
    a third step of forming at least one hole in a second substrate, in a region which is opposed to the electronic component, the second substrate provided with a wiring;
    a fourth step of providing an electrode on one of the second substrate and the first substrate;
    a fifth step of bonding the electrode to the wiring of the other of the first substrate and the second substrate, thereby bonding the first substrate to the second substrate so as to include the electronic component in a space formed between the first substrate and the second substrate; and
    a sixth step of filling a resin in the space formed between the first substrate and the second substrate so as to apply, to the electronic component and the first substrate, a filling pressure capable of correcting a warpage generated on the electronic component and the first substrate while discharging air from the hole formed in the second substrate.

2. The method of manufacturing an electronic component integrated substrate according to claim 1, wherein the sixth step includes providing, a film on an inside surface of a metal mold, setting the first and second substrates which are bonded to each other in the metal mold in a state that an upper surface of the second substrate abuts on the film and the film covers the hole formed in the second substrate, and then filling the resin in the space formed between the first substrate and the second substrate.

3. The method of manufacturing an electronic component integrated substrate according to claim 1, wherein at the third step the hole is formed in a central position of the region of the second substrate which is opposed to the electronic component.

4. The method of manufacturing an electronic component integrated substrate according to claim 1, wherein at the third step, a plurality of the holes are formed in a straight line along a filling direction of the resin in the region of the second substrate which is opposed to the electronic component in a state that one of the plurality of the holes is formed in a central position of the region of the second substrate which is opposed to the electronic component.

5. The method of manufacturing an electronic component integrated substrate according to claim 1, wherein the electrode includes at least a metal core.

6. The method of manufacturing an electronic component integrated substrate according to claim 1, wherein at the third step, one or more holes are formed in a line along a filling direction of the resin of the region in the second substrate which is opposed to the electronic component.

7. The method of claim 2, wherein the metal mold comprises a gate on a first side and a vent hole on a second, opposite, side and wherein the sixth step includes filling resin through the gate and directly into the space between the first and second substrates and providing suction on the vent hole such that the resin, while moving parallel to planar surfaces of the first and second substrates pushes air from the space between the first and second substrates, the resin eventually filling said space and entering the hole in the second substrate and the vent hole from the area between the first and second substrate.

* * * * *